United States Patent [19]

Lee et al.

[11] Patent Number: 4,798,979
[45] Date of Patent: Jan. 17, 1989

[54] SCHOTTKY DIODE LOGIC FOR E-MODE FET/D-MODE FET VLSI CIRCUITS

[75] Inventors: Gary M. Lee, Highbridge, N.J.; Andrzej Peczalski, Brooklyn Park, Minn.

[73] Assignee: Honeywell Inc., Minneapolis, Minn.

[21] Appl. No.: 910,545

[22] Filed: Sep. 23, 1986

[51] Int. Cl.⁴ ................ H03K 19/017; H03K 19/094; H03K 19/20; H03K 17/04
[52] U.S. Cl. .................................... 307/450; 307/443; 307/448; 307/446
[58] Field of Search ............... 307/475, 304, 450, 457, 307/458, 446, 570, 571, 270, 264, 448, 443

[56] References Cited

U.S. PATENT DOCUMENTS

| | | | |
|---|---|---|---|
| 4,071,774 | 1/1978 | Tokumaru et al. | 307/458 |
| 4,300,064 | 11/1981 | Eden | 307/458 X |
| 4,400,636 | 8/1983 | Andrade | 307/450 X |
| 4,404,480 | 9/1983 | Ransom et al. | 307/304 X |
| 4,405,870 | 9/1983 | Eden | 307/446 |
| 4,418,292 | 11/1983 | Cserhalmi et al. | 307/450 X |
| 4,494,016 | 1/1985 | Ransom et al. | 307/270 X |
| 4,631,426 | 12/1986 | Nelson et al. | 307/450 |
| 4,680,484 | 7/1987 | Saunders | 307/450 X |
| 4,713,559 | 12/1987 | Vu et al. | 307/450 X |

FOREIGN PATENT DOCUMENTS

| | | | |
|---|---|---|---|
| 0053664 | 6/1982 | European Pat. Off. | 307/450 |
| 0085569 | 8/1983 | European Pat. Off. | 307/446 |

Primary Examiner—John S. Heyman
Assistant Examiner—David R. Bertelson
Attorney, Agent, or Firm—William T. Udseth; John G. Shudy, Jr.

[57] ABSTRACT

A digital logic circuit using Schottky diodes as the nonlinear logic element, a single power supply and an E-mode MESFET as an inverter in the open drain configuration. Temperature compensation of the threshold voltage of the E-mode FET is provided. The circuit is particularly suited for use with a GaAs substrate.

15 Claims, 2 Drawing Sheets

NAND

NOR

AND/OR/INVERT

SCHOTTKY DIODE LOGIC FOR E-MODE FET/D-MODE FET VLSI CIRCUITS

BACKGROUND OF THE INVENTION

1. Field of the Invention

This invention relates to digital solid state logic circuits which utilize a single power supply, employ Schottky diodes as the logic elements and use logic signals to the control current in an E-mode FET.

2. Related Art

Eden introduced Schottky diode field effect transistor logic (SDFL) in U.S. Pat. No. 4,300,064. Therein Schottky diodes are used as logic switching elements and the logic signal is used to switch a depletion mode field effect transistor (D-FET). A negative power supply is connected to the cathodes of the Schottky diodes (via a voltage level shifting diode) and to the gate of the switching D-FET. The negative power supply provides the negative potential necessary to switch the negative threshold D-FET. A positive power supply supplies current to the drain of the switching FET via a gate-source shorted D-FET.

Eden's use of Schottky diodes as logic elements reduces the size of logic circuits relative to those employing only FETs as the nonlinear switching elements, and provides a fast switching circuit.

In U.S. Pat. No. 4,405,870 Eden expanded on the above patent by connecting several AND branches in parallel. He labeled this expanded version Schottky diode-diode FET logic (SD$^2$FL). Each AND branch includes a plurality of Schottky diodes as the nonlinear switching elements. The anodes of the switching Schottky diodes are all connected in parallel at a common node. A first pull-up current source is connected to the common node, as well as a negative source of potential (via a series of voltage level shifting diodes). The shifted voltage is used to drive a switching D-FET. The drain of the switching D-FET is connected to a positive source of potential via a source-gate shorted D-FET (i.e. a second pull-up current source). The output is taken at the drain of the switching D-FET. The source of the switching D-FET is grounded.

The above circuits are compact and fast, but the requirement of positive and negative power supplies increases circuit complexity.

SUMMARY OF THE INVENTION

The present invention is a logic circuit adapted to connect to a source of voltage, comprising: an input node, an output node, a voltage reference node, first and second nodes, at least one Schottky diode having its cathode connected to the input node and its anode connected to the first node, a voltage level shifting means connected between the first and second nodes, first and second means for drawing current where the first means for drawing current is connected between the source of voltage and the first node and the second means for drawing current is connected between the second node and the voltage reference point, and a field effect transistor having a gate, a source, and a drain, with the gate connected to the second node, the source connected to the voltage reference point and the drain connected to the output node.

No pull-up current source is directly connected to the drain of the FET, i.e. the FET is in "open-drain" configuration. Instead, the source-drain current of the FET is supplied from a pull-up current source (via a logic element Schottky diode) of a subsequent logic stage. Only one source of potential is employed in the present invention.

With the anodes of a plurality of Schottky diode logic elements connected in parallel at the logic node, the above circuit performs a NAND function for positive logic. If a single Schottky diode is employed as the logic element in the circuit but two such branches each having a single Schottky diode logic element are connected in parallel at the second node, an OR gate (for positive logic) is provided.

An AND/OR/INVERT gate for this logic family is also disclosed.

DESCRIPTION OF THE PREFERRED EMBODIMENT

Figure 1:
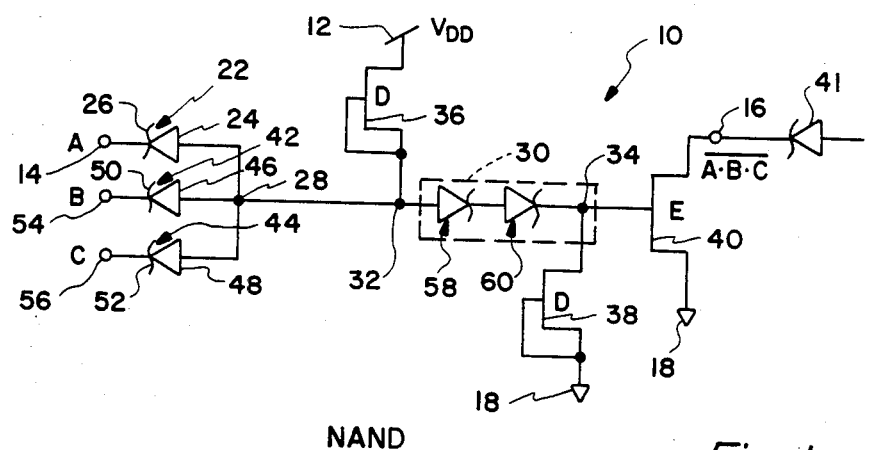
FIG. 1 is a NAND gate employing the circuit of the present invention.

Logic circuit 10 (see FIG. 1) of the present invention is adapted to connect to a source of voltage 12 (i.e. a power supply) and comprises: an input node 14, an output node 16, a voltage reference point 18, at least one Schottky diode 22 having an anode 24 and a cathode 26, a first node 28 (in common with node 30), a voltage level shifting means 32, a second node 34, first 36 and second 38 means for drawing current with the first means for drawing current 36 (e.g. a gate-source shorted D-FET) being connected between power supply 12 and node 30, and the second means for drawing current 38 (e.g. another gate-source shorted D-FET) being connected between the second node 34 and the voltage reference point 18, and means 40 for controlling the flow of current between output node 16 and voltage reference point 18 (e.g. an E-FET). Additional nonlinear logic element Schottky diodes can be connected in parallel with Schottky diode 22 (for example see Schottky diodes 42 and 44) with their respective anodes 46 and 48 connected in parallel at first node 28. Further, the respective cathodes 50 and 52 of Schottky diodes 42 and 44 are connected to additional input nodes 54 and 56.

In operation, output node 16 will also serve as the input node of a subsequent stage. Schottky diode 41 is shown as the nonlinear switching element of such a subsequent stage. FIG. 1 is operated as a digital logic circuit with, for positive logic, the high voltage level being defined as logic state 1 and a low voltage level being defined as logic state 0.

When all of the input nodes in circuit 10 are at a high voltage i.e. logic state 1, Schottky diodes 22, 42 and 44 are reversed biased (or unbiased) and all the current from power supply 12 flows through gate-source shorted D-FET 36, voltage level shifting means 30 and gate-source shorted D-FET 38 to voltage reference point 18. In this condition, circuit 10 will pass the maximum current through D-FET 38 thus placing node 34 in logic state 1. This in turn will turn on E-FET 40 heavily, allowing current from a power supply (such as supply 12 in the next stage) to flow through node 16 to voltage reference point 18. Node 16 will be pulled near the potential at voltage reference point 18, i.e. node 16 will be at logic state 0.

If any of the input nodes 14, 54 and 56 are at a low logic state, the Schottky diode connected to that input node will become forward biased thereby providing a very low impedance path for current from power supply 12 through the forward biased Schottky diode to voltage reference point 18 via a FET similar to FET 40 in a preceding stage. Since the current at node 30 will now be diverted in large part towards node 28, very little if any current will flow to voltage reference point 18 through FET 38. In fact, in one mode of operation Schottky diodes 58 and 60 can be selected such that when any of Schottky diodes 22, 42 or 44 are forward biased the voltage dropped across FET 36 will be large enough so that the voltage at node 30 will be insufficient to forward bias Schottky diodes 58 and 60. Thus Schottky diodes 58 and 60 will not conduct substantial current (i.e. they will in effect be off) and node 34 will be pulled very near the voltage of reference point 18 (very near ground or logic state 0).

In either case where at least one of the inputs A, B or C are at logic state 0, the voltage at node 34 will be very near the voltage at voltage reference point 18, i.e. logic state 0. Thus E-FET 40 will conduct very little, if any, current. In effect, E-FET 40 will act similar to a switch which is open and its output node 16 will be pulled high by the power supply of the next stage.

Thus for positive logic, circuit 10 is a NAND gate, i.e. for input A, B and C, the output is $\overline{A \cdot B \cdot C}$. Of course for negative logic, with inputs A, B and C, circuit 10 will function as an OR gate with an output of A+B+C.

Figure 2:
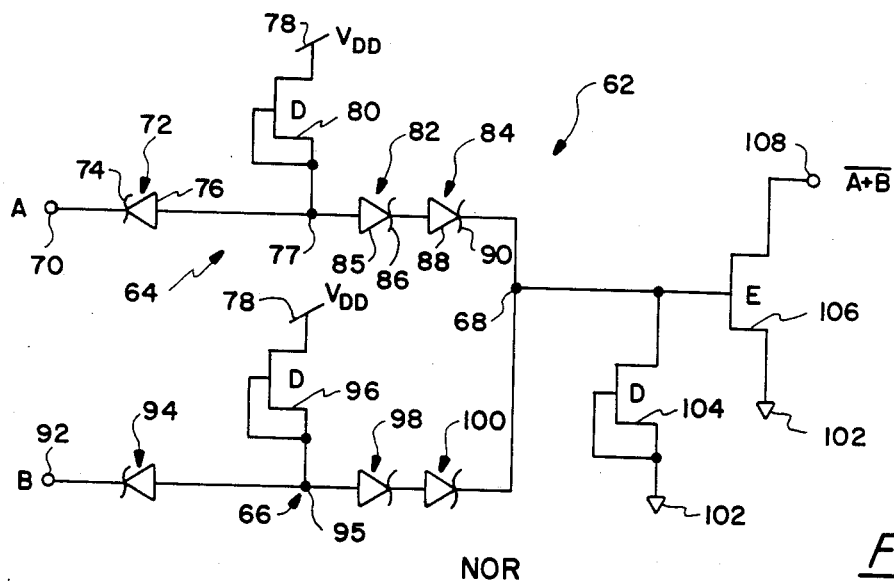
FIG. 2 is an OR gate employing the circuit of the present invention.

The present invention can be employed advantageously in a NOR gate (for positive logic as shown in circuit 62 of FIG. 2). Therein two branches 64 and 66 are connected in parallel at node 68. The branches are the same and branch 64 has an input node 70, a Schottky diode nonlinear switching element 72 having a cathode 74 connected to input node 70 and anode 76 connected to node 77. Node 77 is also connected to positive power supply 78 via means for drawing current 80 (such as a gate-source shorted D-FET). Node 77 is in turn connected to Schottky diodes 82 and 84 which are in series, with the anode 85 of Schottky diode 82 connected to node 77 and the cathode 86 of Schottky diode 82 connected to the anode 88 of Schottky diode 84. Schottky diodes 82 and 84 serve as the voltage level shifting means for branch 64. The cathode 90 of Schottky diode 84 is connected to node 68.

Similarly for branch 66, input node 92 is connected to nonlinear Schottky diode switching element 94 which is in turn connected to node 95. Node 95 is connected to positive power supply 78 via current drawing means 96 (such as another gate-shorted D-FET). Node 95 is connected to series connected Schottky diodes 98 and 100 with Schottky diode 100 connected to voltage reference point 102 (via means for drawing current 104, which is, for example, another gate-source shorted D-FET) and connected to means 106 for controlling the flow of current between output node 108 and voltage reference point 102. Preferably means 106 is an E-FET with its drain connected to output node 108 and its source connected to voltage reference point 102. As in circuit 10, FET 106 is in "open-drain" configuration.

In operation, if either input 70 or 92 of circuit 62 is at logic state 1, then the respective nonlinear switching element Schottky diode (i.e. Schottky diode 72 or 94) would be switched off. In that event all the current in that branch would pass through the voltage level shifting means of that branch and through D-FET 104 to voltage reference point 102. This would place node 68 at logic state 1 thus turning on E-FET 106 heavily, pulling output node 108 to ground, i.e. logic state 0. Only if both inputs A and B are 0 will little or no current flow through D-FET 104. Thus only when inputs A and B are in logic state 0 will node 68 be at logic state 0. When node 68 is in logic state 0 very little current will flow through E-FET 106 and output node 108 will be pulled to the voltage of the power supply in the succeeding stage. Output node 108 will thus be placed in logic state 1. The logic performed by gate 62, for inputs A and B, is $\overline{A+B}$ (i.e. NOR).

Of course for negative logic, circuit 62 will function as AND gate.

Figure 3:
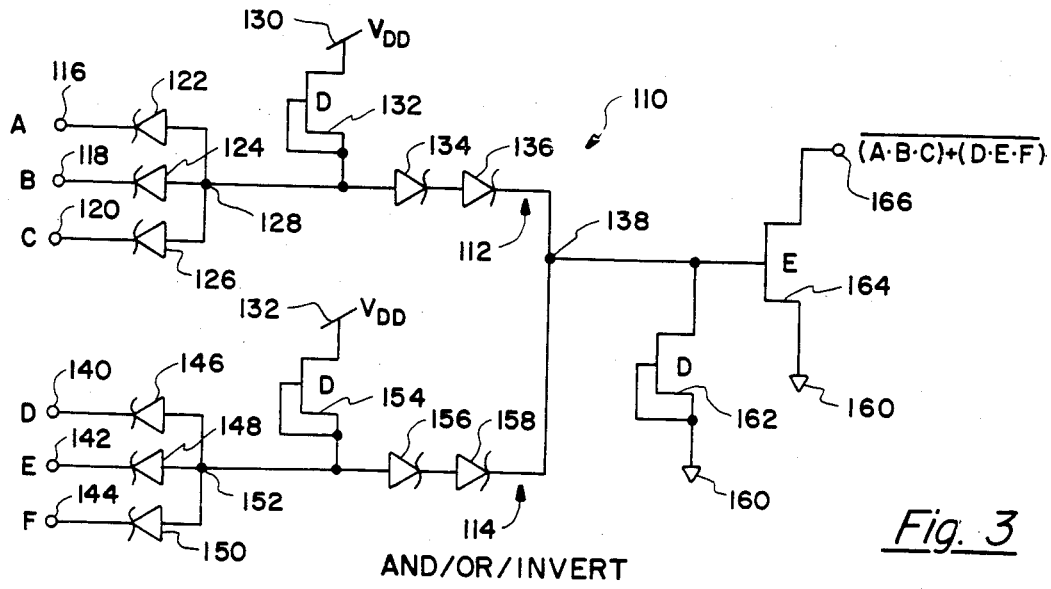
FIG. 3 is a AND/OR/INVERT gate employing the circuit of the present invention.

FIG. 3 shows another application of the present invention. Therein, circuit 110 is provided and, for positive logic, it performs an AND/OR/INVERT function. Circuit 110 has two branches 112 and 114 with each branch being the same. Branch 112 has input nodes 116, 118 and 120, connected, respectively to nonlinear logic switching Schottky diodes 122, 124 and 126 with the anodes of Schottky diodes 122, 124 and 126 being connected in common at node 128. Node 128 is connected to power supply 130 via gate-source shorted D-FET 132. A voltage level shifting means including Schottky diodes 134 and 136 is provided as in circuits 10 and 62, with diodes 134 and 136 series connected. The cathode of Schottky diode 136 is connectd to node 138. In branch 114, input nodes 140, 142 and 144 are connected, respectively, to nonlinear logic switching element Schottky diodes 146, 148 and 150. The anodes of Schottky diodes 146, 148 and 150 are connected to node 152 which in turn is connected, via gate-source shorted D-FET 154, to power supply 132. A voltage level shifting means is provided for the voltage at node 152 by series connected Schottky diodes 156 and 158 with the cathode of Schottky diode 158 connected to node 138. Node 138 is further connected to voltage reference point 160 via gate-source shorted D-FET 162 and to means 164 for controlling the flow of current between output node 166 and voltage reference point 160. Again means 164 is preferably an E-FET with its drain connected in open configuration to output node 166 and its source connected to voltage reference point 160.

In operation, branch 112 will operate like circuit 10 (excluding E-FET 40) to provide an AND logic operation for inputs A, B and C at node 128. Similarly branch 114 will provide an AND logic operation on inputs D, E and F at node 152. As described with respect to circuit 62 since branches 112 and 114 are connected in parallel like branches 64 and 66 of circuit 62, an OR logic operation will be performed at node 138 on the logic states available at nodes 128 and 152. Finally, E-FET 164 will serve to invert the logic condition at node 138.

The above circuits have been given merely by way of example as useful applications of the present invention. The voltage level shifting means could be a resistive means or a FET configured to act as a linear resistive element. Preferably the voltage level shifting means comprises series connected Schottky diodes with each diode positioned so that substantial current can flow in the same direction through all diodes. The number of Schottky diodes employed in voltage level shifting means 32 will vary depending on the voltage levels at which the particular circuit is designed to operate. Two voltage level shifting diodes are shown in circuits 10, 62 and 110 in each of the branches as a preferred configuration.

The various means for drawing current depicted in circuits 10, 62 and 110 are preferably gate-source shorted D-FETs however other FETs or resistive means could be employed.

The means for controlling the flow of current between the output node and the voltage reference point (i.e. means 40, 106 and 164 of the various circuits) can be various switching means adapted to respond to the logic signal presented to it (for example the logic condition at node 34 in circuit 10). The means for controlling the flow of current between the output node and the voltage reference point is preferably an E-FET however. This is because typically an E-FET has a positive threshold voltage (although sometimes the threshold voltage is slightly negative). Thus, as shown in the Figures, no negative voltage supply need be provided and only one voltage supply is needed for the circuit. In circuits 62 and 110, different numerals are used for the voltage supplies, however for convenience these supplies can be the same and typically will be.

The sizes of the various FETs and Schottky diodes employed in the circuits will be highly application dependent but preferably, referring to circuit 10, FET 36 will be several times larger than FET 38. More specifically, it is suggested that FET 36 be four times as large as FET 38. This will allow substantial voltage swing (relative to the available voltage between supply and ground) between the high and low logic states at node 34. If FET 38 is too large, this will increase the minimum possible voltage level at node 34 thus limiting the voltage swing. Also, by keeping the size of FET 38 down power consumption is reduced. E-FET 40 is preferably large, e.g. at least three times larger than FET 36, to thus provide sufficient current to drive a substantial output capacitance and an output low level close to the voltage reference level thereby increasing the voltage swing. Further, voltage level shifting diodes 58 and 60 are preferably substantially larger than input diodes 22, 42 and 44. Diodes 58 and 60 are large to decrease their series resistance. The series resistance of the diodes can change substantially during the processing of an integrated circuit and therefore if the series resistance was too small, the overall characteristics of the circuit would be very highly dependent on the processing. Small size is desired for the input diodes 22, 42 and 44 to keep their input capacitance low which allows them to be switched rapidly.

Figure 4:
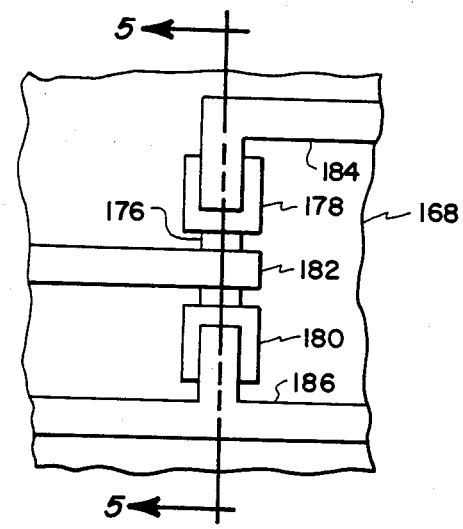
FIG. 4 is an elevational view of a portion of the circuit of FIG. 1.
Figure 5:
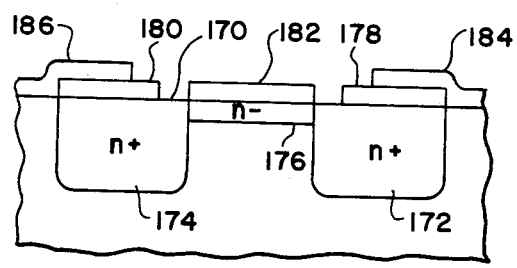
FIG. 5 is a cross-sectional view taken along line 5—5 of FIG. 4.

FIGS. 4 and 5 show a portion of an integrated circuit employing the present invention. In particular FIG. 4 shows a plan view of E-FET 40 and connecting conductors. Therein the solid component 168 (which is typically a substrate or an expitaxial layer of either a semiconductor or semi-insulating material) has an upper principal surface 170 with a drain 172 and source region 174 formed therein.

Typically drain and source 172 and 174 will be heavily doped with the same conductivity type and there will be a shallow channel region 176 disposed between the drain and source region. Drain 172, source 176 and channel 176 all extend into solid component 168 from principal surface 170. The channel is typically doped with the same conductivity type as the drain and source but to a lesser degree. Overlaying each of drain 172, source 174 and channel 176 are conductive (preferably metal) components 178, 180 and 182 respectively.

Conductive members 178 and 180 simply serve as ohmic contacts to the underlying respective drain 172 and source 174 regions, however gate 182 typically forms a Schottky contact with channel region 176. A second metallized layer is typically provided to form conductor 184 leading from drain contact 178 to the output and also to form conductor 186 leading to ground or voltage reference point 18.

Figure 6:
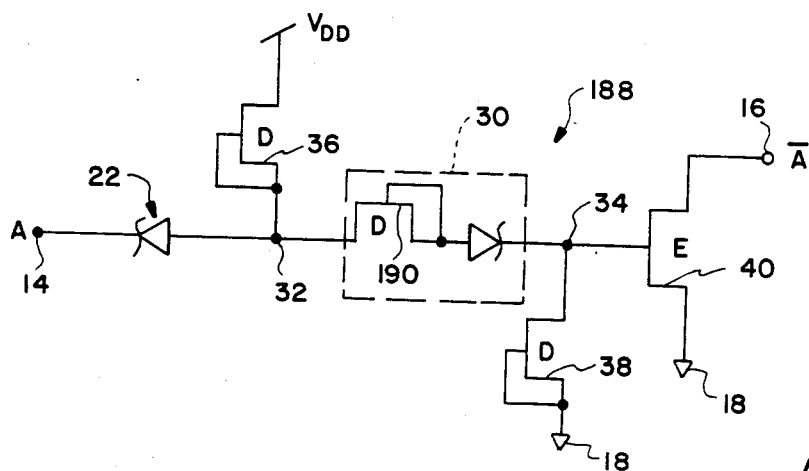
FIG. 6 is a temperature compensated version of the present invention.

FIG. 6 shows a circuit 188 which is a variation of circuit 10 but with a gate-source shorted D-FET 190 substituting for diode 58 and having a single input. Corresponding structure is like-numbered between circuits 10 and 188. The resistance afforded by D-FET 190 can be selected to provide a different voltage drop than the barrier voltage of a Schottky diode. Thus the voltage drop across voltage level shifter 30 can be finely adjusted to provide a drop which is not a multiple of the Schottky diode barrier voltage.

Further, the resistance of D-FET 190 has a positive temperature coefficient, thus it serves to compensate for the negative temperature coefficient of the threshold voltage of E-FET 40. Thus circuit 188 is a temperature compensated version of circuit 10. Similar temperature compensating D-FETs can be substituted in the other circuits disclosed herein.

A computer simulation of circuit 188 with the below listed component sizes (in microns), an output capacitance of 15 ff, and VDD of 1.7 V DC, has resulted in a switching speed of 0.753 nanoseconds, power dissipation of 191$\mu$ watts, a voltage swing of about 0.8 volts, and a noise region margin of 250$\mu$ V. The component sizes were: diode 22 1×3, D-FET 36 1×9, D-FET 190 1×4.5, diode 60 1×3, D-FET 38 1×3.5 and E-FET 40 1×20 and the substrate was GaAs.

Substrate material component 168 is preferably GaAs or GaAlAs. Other good substrate material components are III–V materials such as InP. Group IV semiconductor materials may be used however. "Substrate", as used herein, can be an epitaxial material.

Note further that modulation doped FETs (MOD-FETs) can be advantageously employed as the means for controlling the current between the output node and the voltage reference point, although more typically, due to ease of processing, standard E-FET metal-semiconductor FETs (MESFETs) will be used.

For convenience, the logic family encompassed by the present invention can be referred to as Schottky FET logic (SFL).

What is claimed is:

1. A digital logic circuit, connected to a source of electrical potential, consisting only:
   an input node;
   an output node;
   a voltage reference point;
   a Schottky diode having an anode and a cathode, wherein said cathode is connected to said input node and said node is connected to a first node;
   means for shifting the voltage level, wherein said means for shifting the voltage level is connected between said first node and a second node;
   first and second means for drawing current, wherein said first means for drawing current is connected between said source of electrical potential and said first node, and said second means for drawing current is connected between said second node and said voltage reference point; and means for controlling the flow of current between said output node and said voltage reference point, said means for controlling the flow of current being connected to said second node.

2. A digital logic circuit, connected to a source of electrical potential, consisting only:
   an input node;
   an output node;
   a voltage reference point, having a voltage less than the voltage of said source of electrical potential;
   first and second nodes;
   a first Schottky diode having an anode and a cathode, wherein said cathode of said first Schottky diode is connected to said input node and said anode of said first Schottky diode is connected to said first node;
   means for shifting the voltage level, said voltage level shifting means including a second Schottky diode having a direction of high current flow and an opposite direction of low current flow, and wherein said second Schottky diode is connected so that the direction of high current flow is from said first node to said second node;
   first and second means for drawing current, wherein said first means for drawing current is connected between said source of electrical voltage and said first node, and said second means for drawing current is connected between said second node and said voltage reference point; and
   a field effect transistor (FET) having a source, drain and control gate, wherein said drain is connected to said output node, said source is connected to said voltage reference point and said control gate is connected to said second node.

3. The circuit of claim 2 wherein said FET is an enhancement mode FET (E-FET).

4. A digital logic circuit requiring only one power supply voltage consisting only:
   a first plurality of diodes, each diode of said first plurality having a cathode as an individual and separate input node and having an anode;
   first voltage level shifting means, connected to the anodes of said first plurality of diodes, for shifting a voltage level present at the anodes of said plurality of diodes;
   a first field effect transistor having a gate connected to said voltage level shifting means, having a drain connected to an output node and having a source connected to a zero voltage reference source;
   first current means, connected to a positive voltage potential and to the anodes of said first plurality of diodes, for drawing current; and
   second current means, connected to the gate of said first field effect transistor and connected to the zero voltage reference potential, for drawing current.

5. Apparatus for claim 14 wherein said first current means is a second field effect transistor having a drain connected to the positive voltage potential, having a source connected to said first voltage level shifting means, and having a gate connected to the source of said second field effect transistor.

6. Apparatus of claim 5 wherein said second current means is a third field effect transistor having a drain connected to the gate of said first field effect transistor, having a source connected to the zero reference voltage potential, and having a gate connected to the source of said third field effect transistor.

7. Apparatus of claim 6 wherein said first field effect transistor is an enhancement mode transistor operating in an open drain configuration.

8. Apparatus of claim 7 wherein said second and third field effect transistors are depletion mode field effect transistors.

9. A digital logic circuit, connected to a source of electrical potential, consisting only:
   an input node;
   an output node;
   a voltage reference point, having a voltage less than the voltage of said source of electrical potential;
   first and second nodes;
   a first Schottky diode having an anode and a cathode, wherein said cathode of said first Schottky diode is connected to said input node and said anode of said first Schottky diode is connected to said first node;
   means for shifting the voltage level, said voltage level shifting means including a second Schottky diode having a direction of high current flow and an opposite direction of low current flow, and wherein said second Schottky diode is connected so that the direction of high current flow is from said first node to said second node;
   first and second means for drawing current, wherein said first means for drawing current is connected between said source of electrical voltage and said first node, and said second means for drawing current is connected between said second node and said voltage reference point;
   a field effect transistor (FET) having a source, drain and control gate, wherein said source is connected to said voltage reference point and said control gate is connected to said second node; and
   a third Schottky diode having a cathode and an anode, wherein said drain is connected to said cathode of said third Schottky diode and said output node is connected to said anode of said diode and wherein current can only flow between said source and said drain by first flowing through said third Schottky diode.

10. A digital logic circuit, connected to a source of electrical potential, consisting only:
    an input node;
    an output node;
    a voltage reference point, having a voltage less than the voltage of said source of electrical potential;
    first and second nodes;
    a first Schottky diode having an anode and a cathode, wherein said cathode of said first Schottky diode is connected to said input node and said anode of said first Schottky diode is connected to said first node;
    means for shifting the voltage level, said voltage level shifting means including a second Schottky diode having a direction of high current flow and an opposite direction of low current flow, and wherein said second Schottky diode is connected so that the direction of high current flow is from said first node to said second node;
    first and second means for drawing current, wherein said first means for drawing current is connected between said source of electrical voltage and said first node, and said second means for drawing current is connected between said second node and said voltage reference point;

a field effect transistor (FET) having a source, drain and control gate, wherein said drain is connected to said output node, said source is connected to said voltage reference point and said control gate is connected to said second node; and a third Schottky diode, having an anode and a cathode; and a second input node, wherein said cathode of said third Schottky diode is connected to said second input node and said anode of said third Schottky diode is connected to said first node, and wherein when logic input signals are applied to each of said input nodes, a logic output appears at said output node which represents the NAND logic operation for said logic input signals.

11. A digital logic circuit, connected to a source of electrical potential, consisting only:
an input node;
an output node;
a voltage reference point, having a voltage less than the voltage of said source of electrical potential;
first and second nodes;
a first Schottky diode having an anode and a cathode, wherein said cathode of said first Schottky diode is connected to said input node and said anode of said first Schottky diode is connected to said first node;
means for shifting the voltage level, said voltage level shifting means including second and third Schottky diodes connected in series having a direction of high current flow and an opposite direction of low current flow, and wherein said second and third Schottky diodes are connected so that the direction of high current flow is from said first node to said second node;
first and second means for drawing current, wherein said first means for drawing current is connected between said source of electrical voltage and said first node, and said second means for drawing current is connected between said second node and said voltage reference point; and
a field effect transistor (FET) having a source, drain and control gate, wherein said drain is connected to said output node, said source is connected to said voltage reference point and said control gate is connected to said second node.

12. A digital logic circuit, connected to a source of electrical potential, consisting only:
an input node;
an output node;
a voltage reference point, having a voltage less than the voltage of said source of electrical potential;
first and second nodes;
a first Schottky diode having an anode and a cathode, wherein said cathode of said first Schottky diode is connected to said input node and said anode of said first Schottky diode is connected to said first node;
means for shifting the voltage level, said voltage level shifting means including a second Schottky diode having a direction of high current flow in an opposite direction of low current flow, and a second FET, wherein said second FET functions as a resistive means and is connected in series with said second Schottky diode, and wherein said second Schottky diode and said second FET are connected so that the direction of high current flow is from said first node to said second node;
first and second means for drawing current, wherein said first means for drawing current is connected between said source of electrical voltage and said first node, and said second means for drawing current is connected between said second node and said voltage reference point; and
a field effect transistor (FET) having a source, drain and control gate, wherein said drain is connected to said output node, said source is connected to said voltage reference point and said control gate is connected to said second node.

13. A digital logic circuit requiring only one power supply voltage consisting only:
a first plurality of diodes, each diode of said first plurality having a cathode as an individual and separate input node and having an anode;
first voltage level shifting means consisting:
a fourth field effect transistor having a drain connected to the anodes of said first plurality of diodes, and having a gate and a source connected together; and
a diode having an anode connected to the source and gate of said fourth field effect transistor and having a cathode connected to the gate of said first field effect transistor;
a first field effect transistor having a gate connected to said voltage level shifting means, having a drain connected to an output node and having a source connected to a zero voltage reference source;
first current means, connected to a positive voltage potential and to the anodes of said first plurality of diodes, for drawing current;
second current means, connected to the gate of said first field effect transistor and connected to the zero voltage reference potential, for drawing current;
a second plurality of diodes, each diode of said second plurality of having a cathode as an individual and separate input mode and having an anode;
second voltage level shifting means consisting:
a fifth field effect transistor having a drain connected to the anodes of said second plurality of diodes, and having a gate and a source connected together; and
a diode having an anode connected to the source and gate of said fifth field effect transistor and having a cathode connected to the gate of said first field effect transistor; and
third current means, connected to the positive voltage potential and to the anodes of said second plurality of diodes, for drawing current.

14. A digital logic circuit requiring only one power supply voltage consisting only:
a first plurality of diodes, each diode of said first plurality having a cathode as an individual and separate input node and having an anode;
first voltage level shifting means consisting of a diode having an anode connected to the anodes of said first plurality of diodes and a cathode;
a first field effect transistor having a gate connected to said voltage level shifting means, having a drain connected to an output node and having a source connected to a zero voltage reference source;
first current means, connected to a positive voltage potential and to the anodes of said first plurality of diodes, for drawing current;
second current means, connected to the gate of said first field effect transistor and connected to the zero voltage reference potential, for drawing current;

a second plurality of diodes, each diode of said second plurality having a cathode as an individual and separate input mode and having an anode;

second voltage level shifting means consisting of a diode having an anode connected to the anodes of said second plurality of diodes, and having a cathode connected to the gate of said first field effect transistor; and third current means, connected to the positive voltage potential and to the anodes of said second plurality of diodes, for drawing current.

15. A digital logic circuit requiring only one power supply voltage, consisting only:

a first plurality of diodes, each diode of said first plurality having a cathode as an individual and separate input node and having an anode;

first voltage level shifting means, having a second plurality of diodes connected in series, connected to the anodes of said first plurality of diodes, for shifting a voltage level present at the anodes of said plurality of diodes;

a first field effect transistor having a gate connected to said voltage level shifting means, having a drain connected to an output node and having a source connected to a zero voltage reference source;

first current means, connected to a positive voltage potential and to the anodes of said first plurality of diodes, for drawing current;

second current means, connected to the gate of said first field effect transistor and connected to the zero voltage reference potential, for drawing current;

a third plurality of diodes, each diode of said third plurality having a cathode as an individual and separate input node and having an anode;

second voltage level shifting means, having a fourth plurality of diodes connected in series, connected to the anodes of said third plurality of diodes and connected to the gate of said first field effect transistor; and third current means, connected to the positive voltage potential and to the anodes of said third plurality of diodes, for drawing current.

* * * * *